(12) United States Patent
Zeiger et al.

(10) Patent No.: US 7,106,061 B2
(45) Date of Patent: Sep. 12, 2006

(54) PROBE HEAD FOR NUCLEAR MAGNETIC RESONANCE MEASUREMENTS

(75) Inventors: Heinz Zeiger, Waldbronn (DE); Baudouin Dillmann, Strasbourg (FR)

(73) Assignee: Bruker BioSpin GmbH, Rheinstetten-Forchheim (DE)

( * ) Notice: Subject to any disclaimer, the term of this patent is extended or adjusted under 35 U.S.C. 154(b) by 0 days.

(21) Appl. No.: 11/011,758

(22) Filed: Dec. 14, 2004

(65) Prior Publication Data
US 2005/0168223 A1 Aug. 4, 2005

(30) Foreign Application Priority Data
Dec. 16, 2003 (DE) ................. 103 61 347

(51) Int. Cl.
*G01V 3/00* (2006.01)
(52) U.S. Cl. ..................... 324/318; 324/322
(58) Field of Classification Search ............... 324/318, 324/322
See application file for complete search history.

(56) References Cited

U.S. PATENT DOCUMENTS

| 4,833,412 | A | * | 5/1989 | Zens ........................ 324/322 |
| 4,952,879 | A | * | 8/1990 | Van Vaals et al. .......... 324/322 |
| 5,229,724 | A | | 7/1993 | Zeiger |
| 5,424,645 | A | * | 6/1995 | Doty ........................ 324/318 |
| 5,675,254 | A | * | 10/1997 | Fiat et al. .................. 324/318 |
| 6,307,371 | B1 | * | 10/2001 | Zeiger ...................... 324/318 |
| 6,313,631 | B1 | * | 11/2001 | Fiat et al. .................. 324/318 |
| 6,933,725 | B1 | * | 8/2005 | Lim et al. .................. 324/322 |
| 2005/0280417 | A1 | * | 12/2005 | Weiss et al. ................ 324/322 |
| 2005/0280418 | A1 | * | 12/2005 | Weiss et al. ................ 324/322 |

OTHER PUBLICATIONS

Martin RW et al., "Design of a triple resonance magic angle sample spinning probe for high field solid state nuclear magnetic resonance", Review of Scientific Instruments, vol. 74, No. 6, Jun. 2003; pp. 3045-3061; 2003 American Institute of Physics.*

Rachel W. Martin, et al., "Design of a triple resonance magic angle sample spinning probe for high field solid state nuclear magnetic resonance"; Review of Scientific Instruments; vol. 74, No. 6; Jun. 2003; pp. 3045-3061; 2003 American Institue of Physics.

(Continued)

*Primary Examiner*—Diego Gutierrez
*Assistant Examiner*—Jeremiah Shipman
(74) *Attorney, Agent, or Firm*—Kudirka & Jobse, LLP

(57) ABSTRACT

A probe head for nuclear magnetic resonance measurements is disclosed in which at least a first kind of nuclei with a first, higher resonance frequency and a second kind of nuclei with a second, lower resonance frequency are excited within a magnetic field. The probe head comprises a first input/output terminal for the higher resonance frequency and a second input/output terminal for the lower resonance frequency. A measuring coil cooperates with a sample. The measuring coil has a first terminal end and a second terminal end. The first terminal end is coupled to the first input/output terminal and the second terminal end is coupled to the second input/output terminal. A stop circuit tuned to signals of the higher resonance frequency is arranged between the second terminal end and the second input/output terminal. The stop circuit, further, comprises a line having a length equalling a quarter wave length of the higher resonance frequency. The first line is arranged in series with the measuring coil.

12 Claims, 6 Drawing Sheets

OTHER PUBLICATIONS

V. R. Cross, et al., "Single coil probe with transmission-line tuning for nuclear magnetic double resonance"; Rev. Sci. Instrum., vol. 47, No. 12, Dec. 1976; pp. 1486-1487; 1976 American Institute of Physics.

Anne Leroy-Willig et al., A simplified double-tuned $^{31}$P-$^{1}$H circuit for NMR *in vivo* spectroscopic experiments; Rev. Sci. Instrum. 61 (2), Feb. 1990; pp. 799-801; 1990 American Institute of Physics.

* cited by examiner

PROBE HEAD FOR NUCLEAR MAGNETIC RESONANCE MEASUREMENTS

FIELD OF THE INVENTION

The present invention is related to the field of nuclear magnetic resonance (NMR). More specifically, the invention is related to probe heads or sample heads as are used for conducting NMR measurements in which at least two distinct kinds of nuclei are excited, for example with one kind of nuclei being observed while the other kind of nuclei is saturated.

BACKGROUND OF THE INVENTION

U.S. Pat. No. 5,229,724 in FIG. 1A discloses a probe head for NMR measurements in which at least a first kind of nuclei, namely protons ($^1H$) with a first, higher resonance frequency and a second kind of nuclei, for example $^{15}N$ or $^{31}P$ (X) with a second, lower resonance frequency are excited within a magnetic field. The probe head comprises a first input/output (I/O) terminal for feeding a signal of the $^1H$ resonance frequency so as to excite $^1H$ nuclei and to receive, resp., a resonance signal emitted by the $^1H$ nuclei. A second I/O terminal is also provided for feeding a signal of the X resonance frequency so as to excite X nuclei and to receive, resp., a resonance signal emitted by the X nuclei. A measuring coil within the probe head cooperates with a sample. It may surround the sample or be applied to a surface thereof. The measuring coil has a first terminal end and a second terminal end. The first terminal end is coupled to the $^1H$ I/O terminal and the second terminal end is coupled to the X I/O terminal. A stop circuit is tuned to signals of the $^1H$ resonance frequency and is arranged between the second terminal end and the X I/O terminal. The stop circuit comprises a coaxial line having a length equalling a quarter wave length $\lambda_H/4$ of the $^1H$ resonance frequency.

This prior art, hence, utilizes a $\lambda_H/4$ line on the X side of the measuring coil to act as a $^1H$ stop, with one end of the $\lambda_H/4$ line connected to the X side of the measuring coil and the other end being open. The X side also connects to the X I/O terminal. The $\lambda_H/4$ line is, therefore, arranged transversely thereto.

This prior art probe head, therefore, has a first disadvantage that the measuring coil is operated non-symmetrically. The X end of the measuring coil to which the $\lambda_H/4$ line is connected, is namely "cold" for the $^1H$ frequency because the $\lambda_H/4$ line acts as a short. In contrast, the other end of the measuring coil that is connected to the $^1H$ I/O terminal is "hot" for the $^1H$ frequency. This non-symmetry results in inhomogeneities of the high frequency magnetic field within the measuring coil.

A second disadvantage of this prior art probe head consists in that a capacitor is provided directly at the "cold" end of the measuring coil. This capacitor is, hence, directly exposed to the temperature of the measuring coil which may vary within broad ranges when the sample is brought to varying measuring temperatures by means of an appropriate variable temperature control unit. At high temperatures, however, the breakdown voltage or, speaking in more general terms, the rating, in particular the power rating of capacitors goes down. On the other hand, in the field of NMR it is always desired to make measurements at radio frequency power levels being as high as possible. For example, when measurements are made in the area of 0.5 kW, this power level corresponds to a peak voltage of 5 kV at a measuring frequency of 800 MHz or, via the gyromagnetic ratio of the particular kind of nuclei involved, to a magnetic field amplitude of between 100 and 200 kHz.

A third disadvantage of this prior art probe head consists in that the $\lambda_H/4$ line in its orientation transverse to the X signal line results in a construction with a considerable radial dimension. For so-called "wide bore" applications this may be acceptable because there is enough space available within the bore of the cryostat of a superconducting magnet. However, for other applications with a narrow bore, large radial dimensions of a probe head are prohibitive.

In a scientific article of Martin, R. et al. entitled "Design of a triple resonance magic angle spinning probe for high field solid state nuclear magnetic resonance" in Review of Scientific Instruments, Vol. 74, page 3045 (2003) a probe head is disclosed (see FIG. 1(a)) in which a coaxial line, arranged within the X signal line, is directly connected to the lower frequency X side of the measuring coil. However, the $^1H$ stop in this prior art probe head is also configured as a further coaxial line being likewise directly connected to the X side of the measuring coil and transversely to the X signal line. This further coaxial line likewise transforms its open free end as a $^1H$ short or node, resp., having impedance zero ("cold") to the X side of the measuring coil. In contrast, on the opposite $^1H$ side of the coil, the impedance for $^1H$ is infinite ("hot"). The measuring coil is, therefore also operated asymmetrically.

A similar arrangement is described in a scientific article of Cross, V. R. et al. in J. Am. Chem. Soc., Vol. 98, page 1031 (1976).

It is, therefore, an object, underlying the invention to improve a probe head of the type specified at the outset such that the afore-mentioned disadvantages are overcome. It is a further object underlying the invention to provide a probe head in which the measuring coil can be operated symmetrically. According to another object, the probe head shall be insensitive to high variations in temperature, in particular when variable temperature control units are utilized. Still one more object consists in that the probe head shall have small radial dimensions.

SUMMARY OF THE INVENTION

The afore-mentioned object is achieved by a probe head for nuclear magnetic resonance measurements in which at least a first kind of nuclei with a first, higher resonance frequency and a second kind of nuclei with a second, lower resonance frequency are excited within a magnetic field, the probe head comprising:

a) a first input/output (I/O) terminal for feeding a signal of the first, higher resonance frequency for exciting nuclei of the first kind of nuclei and for receiving, resp., a resonance signal emitted by the nuclei of the first kind of nuclei;

b) a second I/O terminal for feeding a signal of the second, lower resonance frequency for exciting nuclei of the second kind of nuclei and for receiving, resp., a resonance signal emitted by the nuclei of the second kind of nuclei;

c) a measuring coil cooperating with a sample, the measuring coil having a first terminal end and a second terminal end, the first terminal end being coupled to the first I/O terminal and the second terminal end being coupled to the second I/O terminal;

d) a first stop circuit tuned to signals of the higher resonance frequency of the first kind of nuclei, the first stop circuit being arranged between the second terminal end and the second I/O terminal, the first stop circuit, further, comprising a first line having a length equalling a quarter wave length of the higher resonance frequency of the first kind of nuclei, the first line being arranged in series with the measuring coil.

The object underlying the invention is thus entirely solved.

The invention makes it possible to locate the $^1$H stop as close as possible to the measuring coil, for example very close to a MAS rotor (Magic Angle Spinning). Although at that location the $^1$H stop is exposed to highly varying temperatures in the event of experiments involving changing the sample temperature by means of a variable temperature control unit, this is far less critical for e.g. coaxial lines as compared to discrete components, in particular capacitors. The arrangement, thus, becomes frequency-stable and may be exposed to high loads. In applications with a MAS rotor, where the angle must be adapted to be adjusted, the invention provides for lower mechanical loads during adjustment as compared to the prior art, in particular in the area of the soldering joints. This holds true also for high $^1$H measuring frequencies of e.g. 900 MHz.

Moreover, the invention allows to design the probe head with small radial dimensions, because the components are also physically arranged in series.

Last but not least the probe head according to the invention may be operated symmetrically.

In a preferred embodiment of the invention, the first line has a first and a second end, the second end being arranged opposite the measuring coil and being connected to a wave trap circuit generating a constrained oscillation node of the signal of the higher resonance frequency at the second end.

This measure has the advantage that the "hot" point is located at the opposite end of the stop and, hence, that the symmetrical excitation of the measuring coil may be guaranteed.

In another embodiment of the invention, a second line is arranged between the first terminal end of the measuring coil and the first I/O terminal, the second line having a length equalling one half wavelength ($\lambda_H/2$) of the higher resonance frequency of the first kind of nuclei ($^1$H).

This measure, known per se, has the advantage that the measuring coil may be excited effectively.

In that case it is particularly preferred when the second line is configured as a coaxial line having an inner conductor and an outer conductor, the inner conductor and the outer conductor being connected with each other at a middle of the second line via a capacitance.

This measure has the advantage that also the $^1$H side contributes to the symmetrical excitation of the measuring coil.

This advantage becomes still more apparent when the outer conductor of the first line has two ends and is connected to ground at the two ends.

In another embodiment of the invention the second line is configured as a coaxial line having an inner conductor and an outer conductor, the inner conductor and the outer conductor being connected with each other at a middle of the second line via a capacitance and a second stop circuit, the second stop circuit being tuned to signals of the lower resonance frequency of the second kind of nuclei (X).

This measure, too enables an improved symmetry for the excitation of the measuring coil, wherein it is likewise true in this case that a still better effect is achieved, when the outer conductor of the second line has two ends and is connected to ground at the two ends.

In still another embodiment of the invention a third I/O terminal is provided for feeding a signal of a third, still lower resonance frequency, as compared to the second resonance frequency, for exciting nuclei of a third kind of nuclei (Y) and for receiving, resp., a resonance signal emitted by the nuclei of the third kind of nuclei (Y).

This measure has the advantage that also so-called triple resonance experiments may be conducted.

Insofar, it is preferred when the third I/O terminal is coupled to a terminal end of the first stop circuit adjacent the second I/O terminal.

This measure has the advantage that the first stop circuit as such needs no modification.

In a preferred modification of this embodiment, the third I/O terminal is coupled to a terminal of the first stop circuit adjacent the second I/O terminal via a third stop circuit tuned to signals of the lower resonance frequency of the second kind of nuclei (X).

This measure has the advantage that the circuit for the third kind of nuclei (Y) is effectively decoupled against the invasion of signals from the second kind of nuclei (X).

In an alternate embodiment of the invention, the first line is configured as a portion of a third line, the third line having a length equalling a half wave length ($\lambda_x/2$) of the lower resonance frequency of the second kind of nuclei (X), the third I/O terminal being coupled to a first point of an inner conductor of the third line, the first point being at a distance from the measuring coil equalling one quarter wave length ($\lambda_x/4$) of the lower resonance frequency of the second kind of nuclei (X), the second I/O terminal being coupled to a second point of the inner conductor of the third line, the second point being at a distance from the measuring coil equalling one quarter wavelength ($\lambda_H/4$) of the higher resonance frequency of the first kind of nuclei ($^1$H).

This measure has the advantage that a probe head design with very small radial dimensions becomes possible, because the second and the third I/O terminal are located at different axial positions of the probe head.

For reasons of symmetry it is also preferred in this case when the outer conductor of the third line has two ends and is connected to ground at the two ends.

If, in the context of the present application fractions of wavelengths are mentioned, this is to be understood to also include technically feasible multiples of these fractions.

Further advantages of the invention will become apparent form the subsequent description of preferred embodiments and from the enclosed drawing.

It goes without saying that the features of the invention mentioned above and those that will be explained hereinafter may not only be used in the particular given combination but also in other combinations ore alone without leaving the scope of the present invention.

DETAILED DESCRIPTION OF THE PREFERRED EMBODIMENTS

Figure 1:
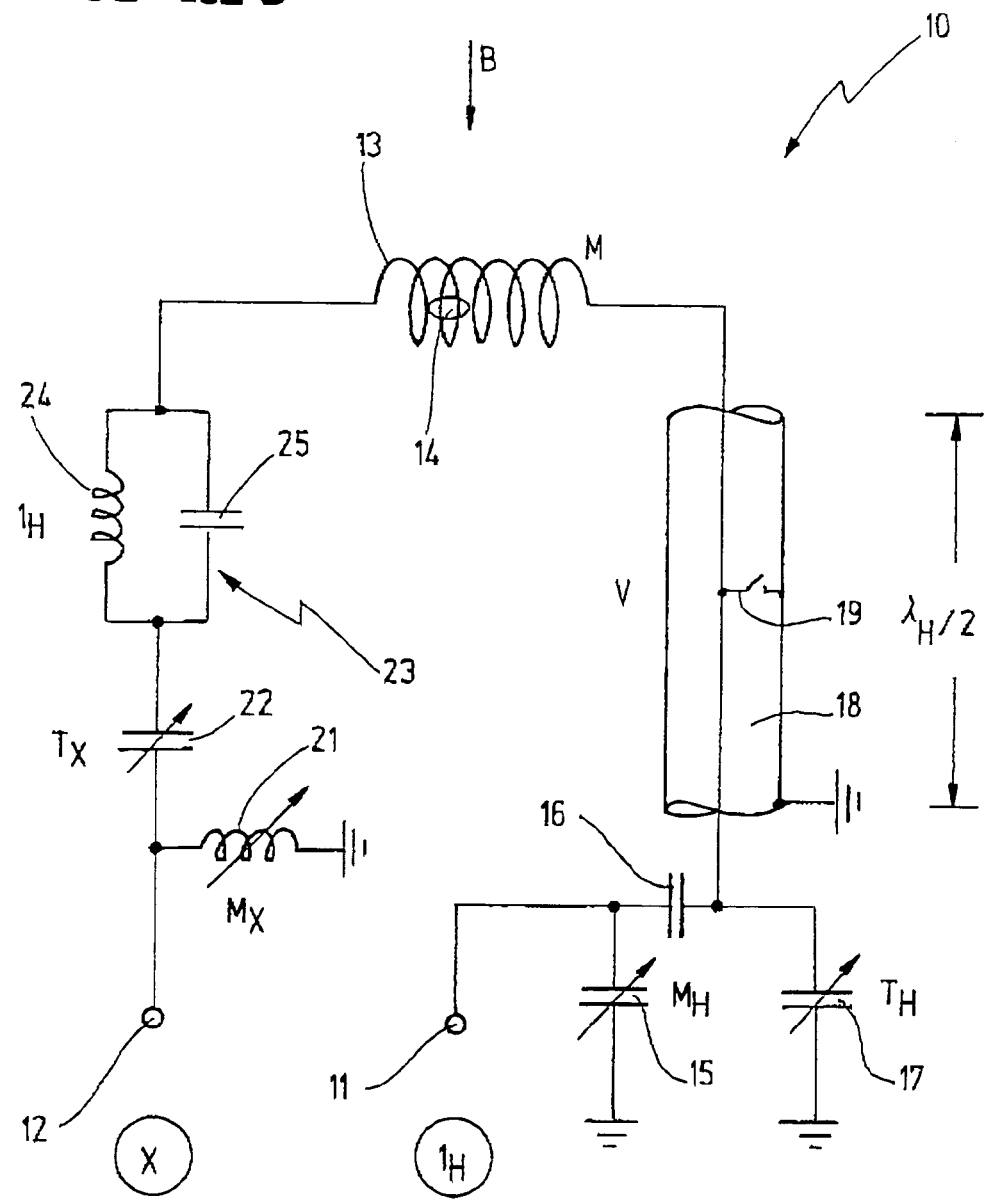
FIG. 1 shows an electrical network of e probe head according to the prior art.

In FIG. 1, reference numeral 10 indicates a probe head according to the prior art. The probe head is depicted as a network or equivalent circuit diagram with its characterizing electrical components.

For exciting and/or receiving signals from a first kind of nuclei, for example for the excitation of protons ($^1$H) a first input/output (I/O) terminal 11 is provided, whereas a second I/O terminal 12 serves for exciting and/or receiving signals from a second kind of nuclei, for example from isotopes of nitrogen ($^{15}$N), or of phosphor ($^{31}$P), generally referred to as "X" nuclei. High frequency signals are fed to or received from I/O terminals 11 and 12, the frequency of which depends on a prevailing static magnetic field B. In the context of the present application the wave length of the signal having the resonance frequency of protons ($^1$H) at the prevailing magnetic field B is designated as $\lambda_H$.

If, in the context of the present application fractions of wavelengths are mentioned, like, for example, $\lambda_H/2$, this is to be understood to also include technically feasible multiples of these fractions like $3\lambda_H/2$ or the like.

As shown in FIG. 1, magnetic field B acts on a measuring coil 13 and on a sample 14 arranged therein. Sample 14 may have the shape of a glass vial with a liquid or a solid chemical substance to be investigated contained therein. Sample 14, however, may also be a biological sample or, in the case of nuclear spin tomography, also referred to as magnetic resonance imaging (MRI), may be a body member or an entire body of a living creature. Measuring coil 13 may also be configured as a surface coil which is placed onto a surface of an object under investigation.

In the context of the present invention emphasis is on so-called "Magic Angle Spinning" (MAS) experiments. In such experiments the measuring coil 13 as well as the sample 14 are contained within a rotating system having an axis which is inclined relative to the direction of the static magnetic field by the so-called "magic angle" and which rotates about that inclined axis. Details of "Magic angle spinning" experiments and apparatuses are well known to the person of ordinary skill in the art of magnetic resonance and need no further explanation in this application.

In FIG. 1 the first I/O terminal 11 of the $^1$H side is connected to a capacitive voltage divider 15, 16, 17, namely, on the one hand, via a tuneable or otherwise adjustable matching capacity 15 to ground and, on the other hand, via a capacitance 16 to a point from which a tuneable trimming capacitance 17 is also switched to ground. The point is further connected to an inner conductor of a coaxial line 18 having a length of $\lambda_H/2$. At a middle point the inner conductor may be connected to the outer conductor of line 18 via a switch 19, as disclosed in further detail in U.S. Pat. No. 5,229,724 of the same applicant, discussed at the outset of this application and the disclosure of which is incorporated herein by way of reference. The opposite end of line 18 is connected to the end of measuring coil 13 being the right hand end in the depiction of FIG. 1.

Second I/O terminal 12 of the X side is connected to ground via a tuneable matching inductance 21 and also via a tuneable trimming capacitance 22 to a so-called $^1$H stop 23. The $^1$H stop 23 is a parallel resonance circuit having an inductance 24 as well as a capacitance 25, acting together as a stop circuit for the $^1$H frequency. The other end of the $^1$H stop 23 is connected to the left hand end of measuring coil 13.

In order to achieve a maximum efficiency of the stop action of $^1$H stop, the latter must be positioned as close as possible to measuring coil 13, i.e. as close as possible to a MAS rotor, for example. However, it is then exposed to highly varying temperatures in the case of variable temperature controlled experiments. It is then no more frequency-stable and may not be exposed to high loads. At high temperatures the risk of damaging capacitance 25 due to an electrical breakdown is also significant. In the application of a MAS rotor, where the inclination angle of the rotor must be adapted to be adjusted, mechanical stresses occur during such adjustment, in particular in the area of soldering joints. While these problems may be more or less sufficiently held under control at measuring frequencies in the conventional 400 MHz range, they present substantial difficulties at frequencies in the 900 MHz range as used today.

In the embodiments of the invention depicted in FIGS. 2 through 6 like elements are designated with the corresponding reference numerals from FIG. 1. In case of modified elements, a letter, characterizing the particular embodiment, is added to the respective reference numeral.

Figure 2:
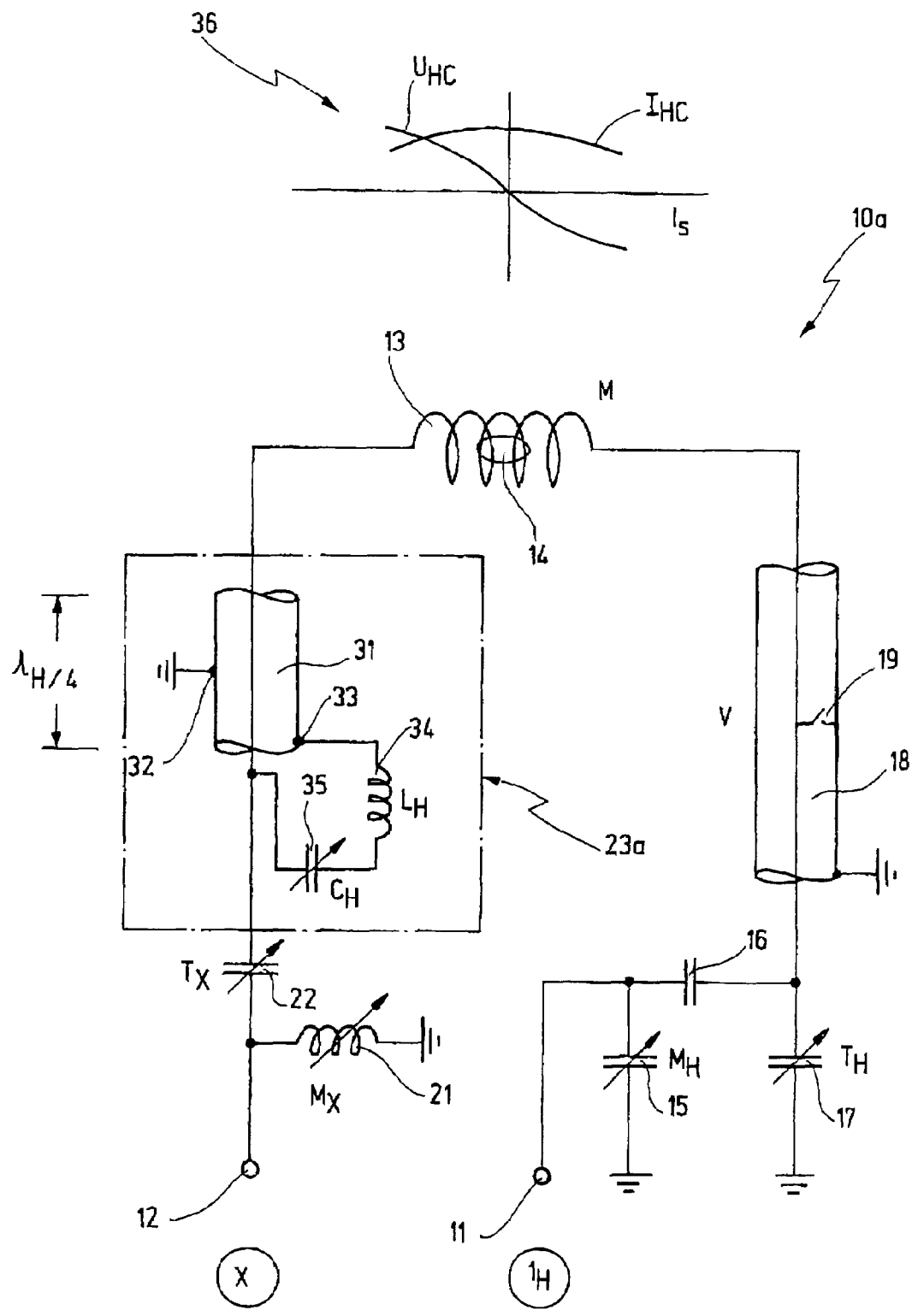
FIG. 2 shows an electrical network of a first embodiment of a probe head according to the invention.

FIG. 2 shows a probe head 10a.

Probe head 10a distinguishes from probe head 10 by the particular design of its $^1$H stop 23a. Instead of a parallel resonance circuit 24, 25, the embodiment of FIG. 2 uses a preferably coaxial line 31 having a length of $\lambda_H/4$. At a middle 32 of its outer conductor, line 31 is connected to ground. A lower end 33 of its outer conductor is connected to the inner conductor of line 31 via a series circuit of an inductance 34 and a tuneable capacitance 35 acting as a wave trap circuit.

Line 31, for example, has a capacity of between 3 and 4 pF. The lower end of the $\lambda_H/4$ line 31 is a "cold" point for $^1$H. The "cold" point, further, is a constrained oscillation node due to the provision of the wave trap circuit 34, 35.

Due to this circuitry measuring coil 13 is operated symmetrically for $^1$H in the first place, i.e. measuring coil 13 is "hot" on both sides and is operated in a push-pull mode. Thereby it is possible to make the distance between the upper end of line 31 and the lower end of measuring coil 13 much smaller as compared to prior art probe heads. The symmetry is also shown in FIG. 2 in a diagram 36 depicting the voltage $U_{HC}$ and the current $I_{HC}$ over the length $l_s$ of measuring coil 13.

Due to the serial connection between line 31 and measuring coil 13 a set up of probe head 10a with very small radial dimensions is possible.

Figure 3:
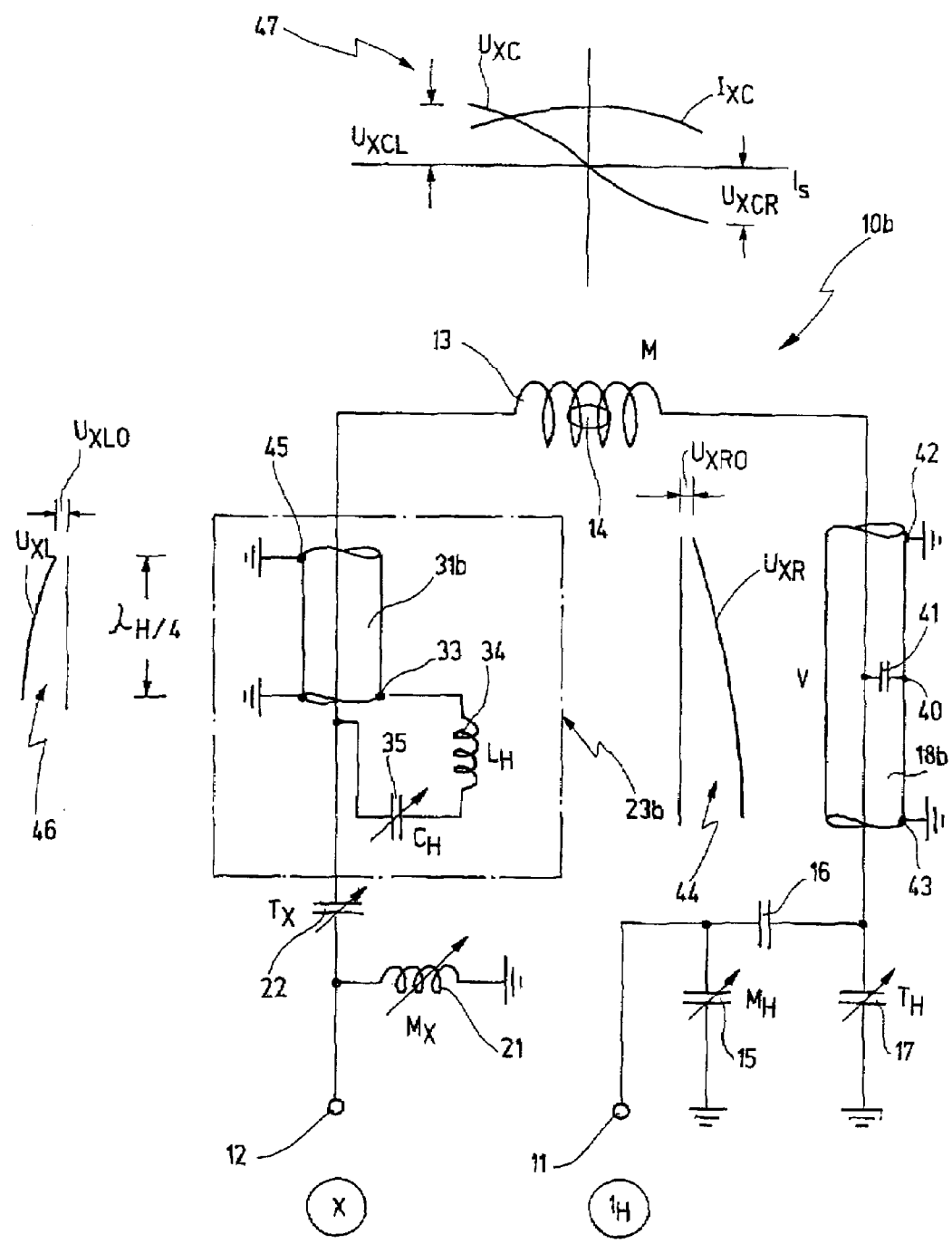
FIG. 3 shows an electrical network of a second embodiment of a probe head according to the invention.

FIG. 3 shows a probe head 10b.

Probe head 10b on the one hand distinguishes from probe head 10a of FIG. 2 in that in the middle 40 of line 18b being $\lambda_H/2$ long, i.e. at a length of $\lambda_H/4$, a capacity 41 is switched between the inner conductor and the outer conductor. Capacitance 41 is, for example, of the order of magnitude of 50 pF which approximately corresponds the size of trimming capacity 22.

On the other hand, line 18b is connected to ground at the two ends 42 and 43 of its outer conductor. Likewise, $\lambda_H/4$ line 31b of stop circuit 23b is also connected to ground at the two ends 33 and 45 of its outer conductor.

Due to these measures measuring coil 13 is operated symmetrically also for X nuclei. A first diagram 44 in FIG. 3 depicts the X voltage $U_{XR}$ at the right hand side of measuring coil 13 along line 18b. A corresponding second diagram 46 for the left hand side depicts voltage $U_{XL}$ along line 31b. One can see from diagrams 44 and 46 that voltages $U_{XR}$ and $U_{XL}$ have the same value $U_{XR0}$ and $U_{XL0}$ at the respective upper end of lines 18b and 31b, resp., evidencing that measuring coil 13 is operated symmetrically.

A third diagram 47 depicts the X voltage $U_{XC}$ and the X current $I_{XC}$ along the length $l_s$ of measuring coil 13. Diagram 47 shows, for example, oppositely equal end values $U_{XCL}$ and $U_{XCR}$, typical for a push-pull operation.

Figure 4:
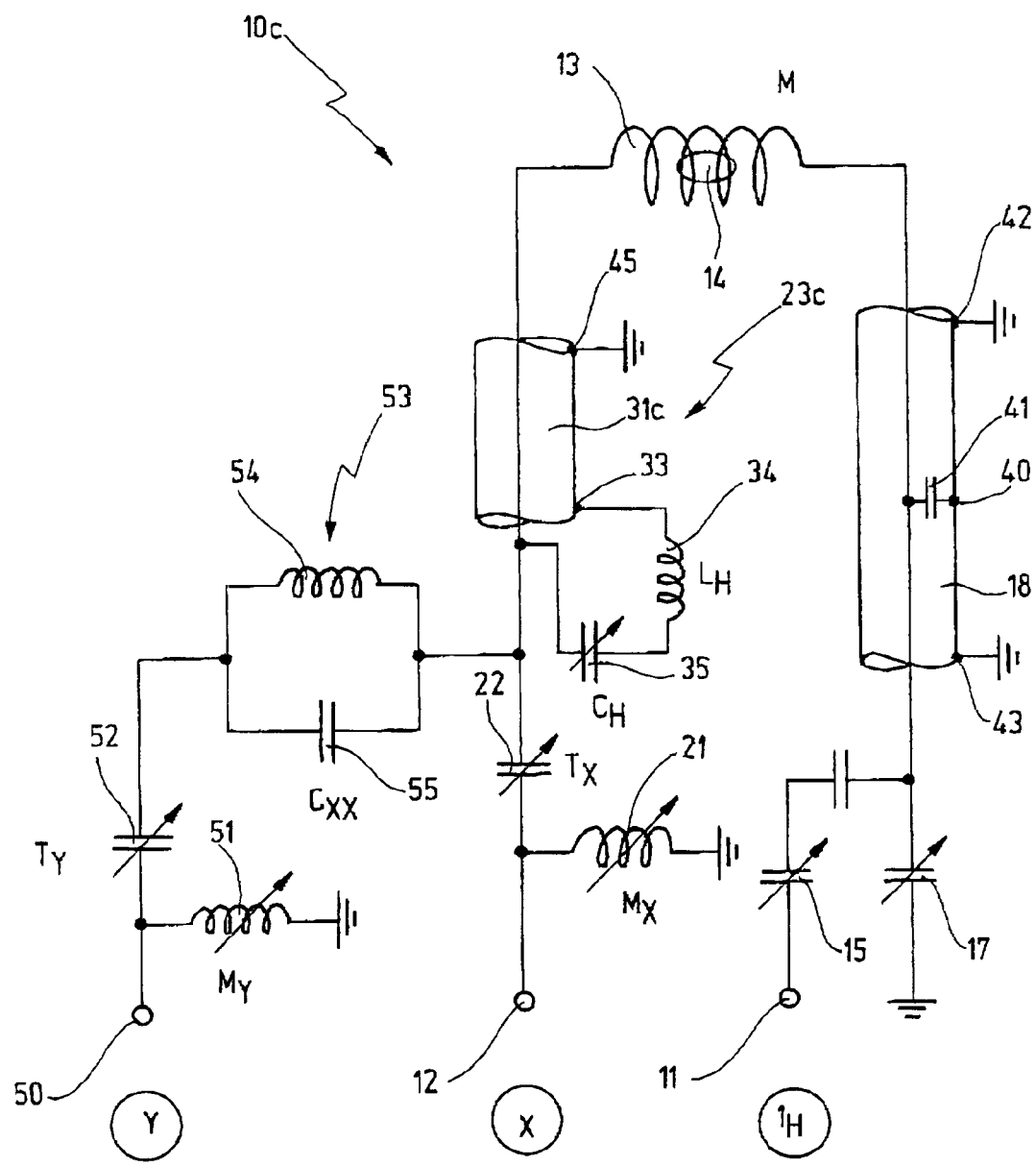
FIG. 4 shows an electrical network of a third embodiment of a probe head according to the invention.

FIG. 4 shows a probe head 10c.

Probe head 10c is special insofar as it allows to feed or receive, resp., a further signal for a further kind of nuclei, referred to in the art as "Y", via a third I/O terminal 50. The third measuring frequency is required for triple resonance experiments.

Third I/O terminal 50 one the one hand is connected with ground via a tuneable matching inductance 51. On the other hand, it is connected to a further stop circuit 53 via a tuneable trimming capacitance 52. Stop circuit 53 is configured as a parallel resonance circuit comprising an inductance 54 and a capacitance 55. It is connected to the end of stop circuit 23c adjacent second I/O terminal 12. Stop circuit 53 stops X frequencies and, therefore, determines the X frequency within a relatively narrow band of e.g. 1%. The Y frequency, in contrast, may be varied within relatively broad ranges, provided it is lower than the X frequency.

Figure 5A:
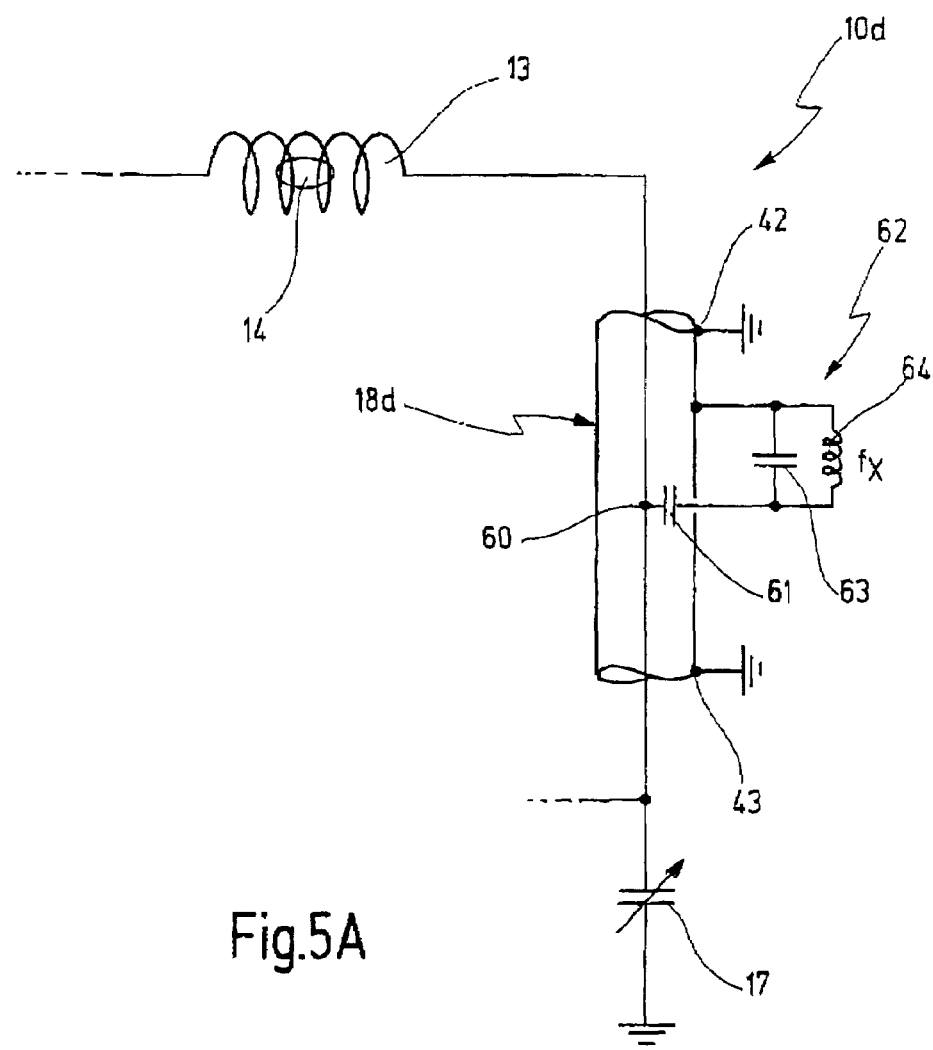
FIG. 5A shows a portion of an electrical network of a fourth embodiment of a probe head according to the invention.

FIG. 5A shows just a portion of a probe head 10d, namely the portion on the right hand side of measuring coil 13. The left hand portion of probe head 10d may be configured according to any of the embodiments shown in FIGS. 2 through 4.

Probe head 10d is special insofar as it has a capacitance 61 coupled to a middle 60 of the inner conductor of $\lambda_H/2$ line 18d. Capacitance 61 connects to one end of a stop circuit 62, the other end of which being connected to the outer conductor of line 18d. Stop circuit 62 is configured as a parallel resonance circuit comprising a capacitance 63 and an inductance 64. Stop circuit 62 stops the X frequency.

Figure 5B:
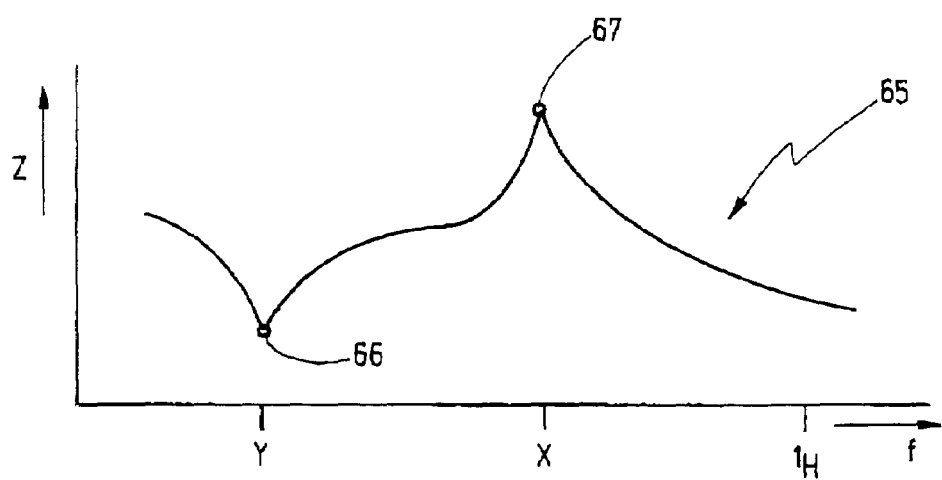
FIG. 5B shows a diagram depicting a complex resistance of a line utilized in the probe head of FIG. 5A.

FIG. 5B shows a diagram 65 depicting the complex resistance Z of line 18d over the frequency f. One can see that the resistance Z has a minimum at the lowermost frequency Y, and has a maximum at the intermediate frequency X. Line 18d is capacitive for both frequencies Y and X.

Figure 6:
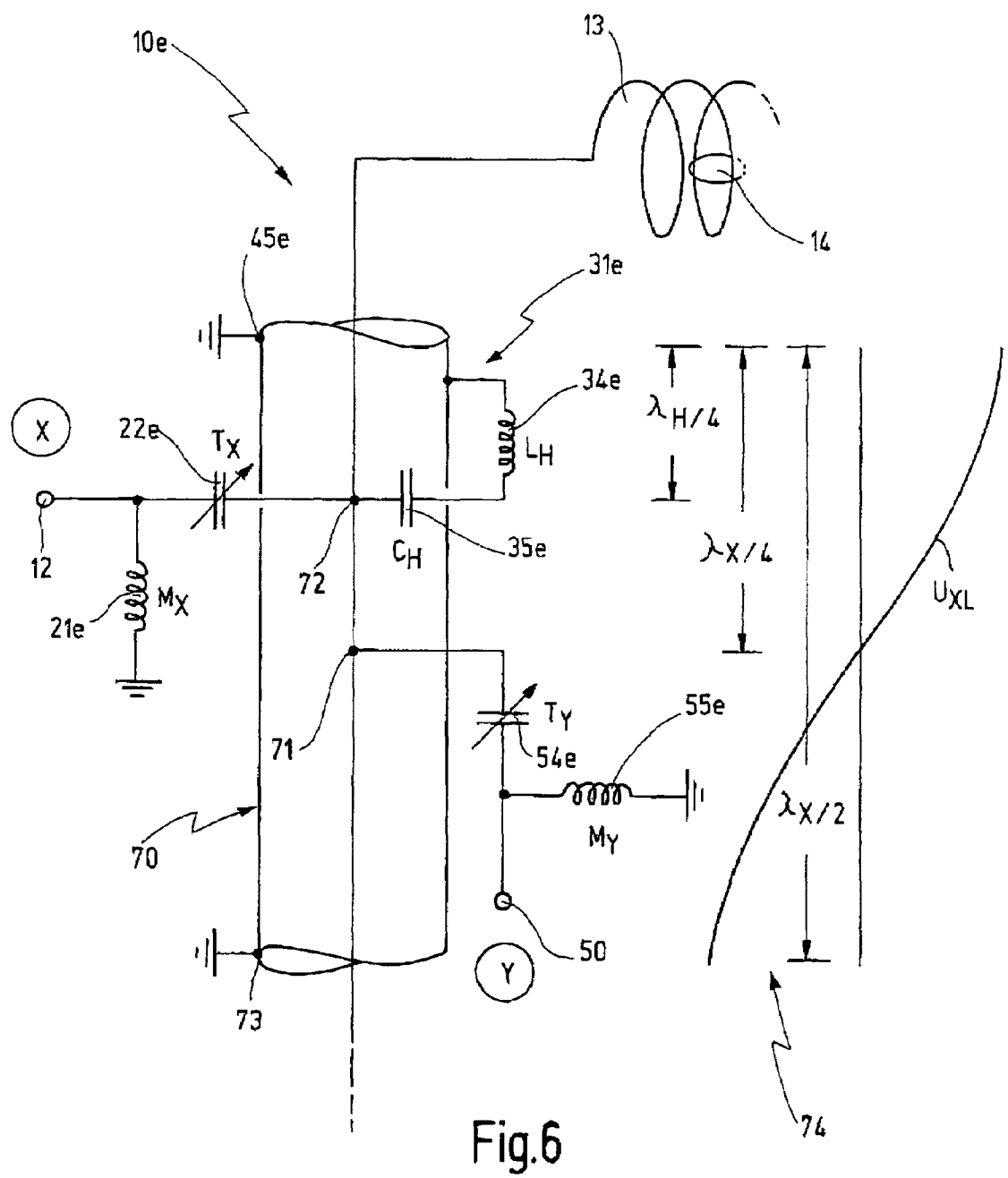
FIG. 6 shows a portion of an electrical network of a fifth embodiment of a probe head according to the invention on a somewhat enlarged scale.

FIG. 6, finally, shows a portion of a probe head 10e, namely the portion on the left hand side of measuring coil 13, on a somewhat enlarged scale. The right hand portion of probe head 10e may be configured according to any of the other embodiments of the present invention.

In probe head 10e the coupling of the third frequency Y is made somewhat different as compared to probe head 10c of FIG. 4. Probe head 10e utilizes a line 70 of $\lambda_x/2$ length on the left hand side of measuring coil 13.

A first point 71 on the middle of the inner conductor of line 70, i.e. at $\lambda_x/4$, connects to a network, consisting of a trimming capacitance 54e and a matching inductance 55e which, in turn, connects to the third I/O terminal 50 for the Y frequency. Matching inductance 55e connects to ground. The first point 71 on the inner conductor, being the point at which the Y frequency is coupled in, therefore, lies on an oscillation node for the X frequency, i.e. on zero potential.

At a distance of $\lambda_H/4$ from the upper end 45e of line 70, as shown in FIG. 6, there is positioned a second point 72 on the inner conductor. By doing so, the $\lambda_H/4$ line of the present invention is integrated into the $\lambda_H/2$ line 70. Second point 72 on the inner conductor, connects to the one hand, to the network consisting of trimming capacity 22e and matching inductance 21e which, in turn, connects to second I/O terminal 12 for the X frequency. On the other hand, second point 72 on the inner conductor connects to the wave trap circuit consisting of capacitance 35e and inductance 34e, constraining potential zero for the $^1$H frequency at the second point 72 on the inner conductor. Line 70 is coupled to ground on both ends of its outer conductor.

The arrangement of FIG. 6 allows to locate terminals 12 and 50 at distinct axial positions of probe head 10e, thus enabling a radially narrower design thereof.

The invention claimed is:

1. A probe head for nuclear magnetic resonance measurements in which at least a first kind of nuclei with a first, higher resonance frequency and a second kind of nuclei with a second, lower resonance frequency are excited within a magnetic field, said probe head comprising:
    a) a first input/output terminal for feeding a signal of said first, higher resonance frequency for exciting said first kind of nuclei and for receiving, resp., a resonance signal emitted by said first kind of nuclei;
    b) a second input/output terminal for feeding a signal of said second, lower resonance frequency for exciting nuclei of said second kind of nuclei and for receiving, resp., a resonance signal emitted by said second kind of nuclei;
    c) a measuring coil cooperating with a sample, said measuring coil having a first terminal end and a second terminal end, said first terminal end being coupled to said first input/output terminal and said second terminal end being coupled to said second input/output terminal;
    d) a first stop circuit tuned to signals of said higher resonance frequency of said first kind of nuclei, said first stop circuit being arranged between said second terminal end and said second input/output terminal, said first stop circuit, further, comprising a first line having a length equalling a quarter wave length of said higher resonance frequency of said first kind of nuclei, said first line being arranged in series with said measuring coil.

2. The probe head of claim 1, wherein said first line has a first and a second end, said second end being arranged opposite said measuring coil and being connected to a wave trap circuit generating a constrained oscillation node of said signal of said higher resonance frequency at said second end.

3. The probe head of claim 1, wherein a second line is arranged between said first terminal end of said measuring coil and said first input/output terminal, said second line having a length equalling one half wavelength of said higher resonance frequency of said first kind of nuclei.

4. The probe head of claim 3, wherein said second line is configured as a coaxial line having an inner conductor and an outer conductor, said inner conductor and said outer conductor being connected with each other at a middle of said second line via a capacitance.

5. The probe head of claim 4, wherein said outer conductor of said second line has two ends and is connected to ground at said two ends.

6. The probe head of claim 3, wherein said second line is configured as a coaxial line having an inner conductor and an outer conductor, said inner conductor and said outer conductor being connected with each other at a middle of said second line via a capacitance and a second stop circuit, said second stop circuit being tuned to signals of said lower resonance frequency of said second kind of nuclei.

7. The probe head of claim 6, wherein said outer conductor of said second line has two ends and is connected to ground at said two ends.

8. The probe head of claim 1, wherein a third input/output terminal is provided for feeding a signal of a third, still lower resonance frequency, as compared to said second resonance frequency, for exciting a third kind of nuclei and for receiving, resp., a resonance signal emitted by said third kind of nuclei.

9. The probe head of claim 8, wherein said third input/output terminal is coupled to a terminal end of said first stop circuit adjacent said second input/output terminal.

10. The probe head of claim 9, wherein said third input/output terminal is coupled to a terminal of said first stop circuit adjacent said second input/output terminal via a third stop circuit tuned to signals of said lower resonance frequency of said second kind of nuclei.

11. The probe head of claim 8, wherein said first line is configured as a portion of a third line, said third line having a length equalling a half wave length of said lower resonance frequency of said second kind of nuclei, said third input/output terminal being coupled to a first point of an inner conductor of said third line, said first point being at a distance from said measuring coil equalling one quarter wave length of said lower resonance frequency of said second kind of nuclei, said second input/output terminal being coupled to a second point of said inner conductor of said third line, said second point being at a distance from said measuring coil equalling one quarter wavelength of said higher resonance frequency of said first kind of nuclei.

12. The probe head of claim 11, wherein said outer conductor of said third line has two ends and is connected to ground at said two ends.

* * * * *